US012685171B2

(12) United States Patent
Cheah et al.

(10) Patent No.: US 12,685,171 B2
(45) Date of Patent: Jul. 14, 2026

(54) SEMICONDUCTOR PACKAGE WITH EXTENDED STIFFENER

(71) Applicant: Intel Corporation, Santa Clara, CA (US)

(72) Inventors: Bok Eng Cheah, Gelugor (MY); Seok Ling Lim, Kulim (MY); Jenny Shio Yin Ong, Bayan Lepas (MY); Jackson Chung Peng Kong, Tanjung Tokong (MY); Kooi Chi Ooi, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 17/857,059

(22) Filed: Jul. 4, 2022

(65) Prior Publication Data

US 2024/0006341 A1      Jan. 4, 2024

(51) Int. Cl.
*H10W 42/00*      (2026.01)
*H10W 70/685*      (2026.01)
*H10W 90/00*      (2026.01)
*H10W 99/00*      (2026.01)

(52) U.S. Cl.
CPC ....... *H10W 42/121* (2026.01); *H10W 70/685* (2026.01); *H10W 90/00* (2026.01); *H10W 99/00* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 2015/0001701 A1* | 1/2015 | Li | ............................. | H05K 5/03 |
| | | | | 257/713 |
| 2020/0402882 A1* | 12/2020 | Kim | ...................... | H01L 23/055 |
| 2022/0310532 A1* | 9/2022 | Yeh | ...................... | H01L 23/3135 |

* cited by examiner

*Primary Examiner* — Hung K Vu
(74) *Attorney, Agent, or Firm* — Viering, Jentschura & Partner mbB

(57)                    ABSTRACT

A semiconductor package including: a package substrate including a base die disposed on a top surface of the package substrate, the base die including a plurality of electrical components disposed on a top surface of the base die, the plurality of electrical components including a first electrical component configured adjacent to a second electrical component, wherein the first electrical component and the second electrical component have an asymmetric form-factor; and a stiffener including: a stiffener main portion, wherein the stiffener main portion is affixed to the top surface of the package substrate and configured at least partially surrounding the base die; and a stiffener extension portion configured to extend from the stiffener main portion to be disposed at least partially over the top surface of the base die adjacent to the first electrical component and the second electrical component.

19 Claims, 9 Drawing Sheets

600

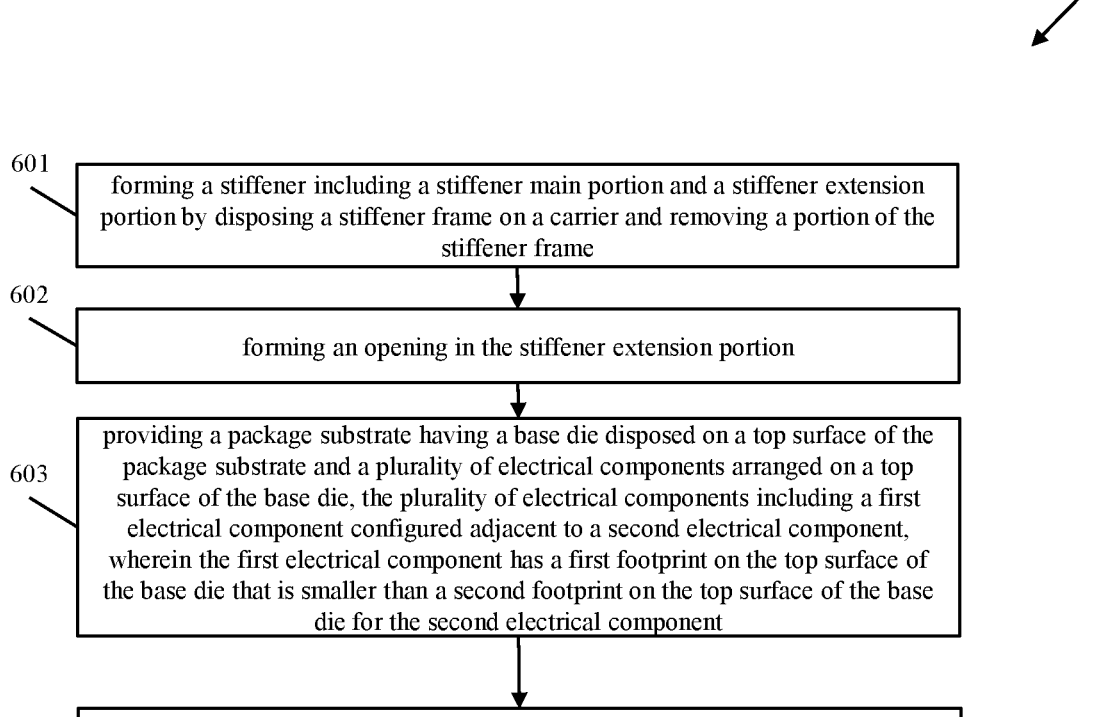

601 — forming a stiffener including a stiffener main portion and a stiffener extension portion by disposing a stiffener frame on a carrier and removing a portion of the stiffener frame 602 — forming an opening in the stiffener extension portion 603 — providing a package substrate having a base die disposed on a top surface of the package substrate and a plurality of electrical components arranged on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component 604 — affixing the stiffener to the package substrate, such that the stiffener main portion is affixed to a top surface of the package substrate adjacent to the base die and the stiffener extension portion is configured to extend from the stiffener main portion to be disposed at least partially over the top surface of the base die adjacent the first electrical component and the second electrical component

FIG. 6

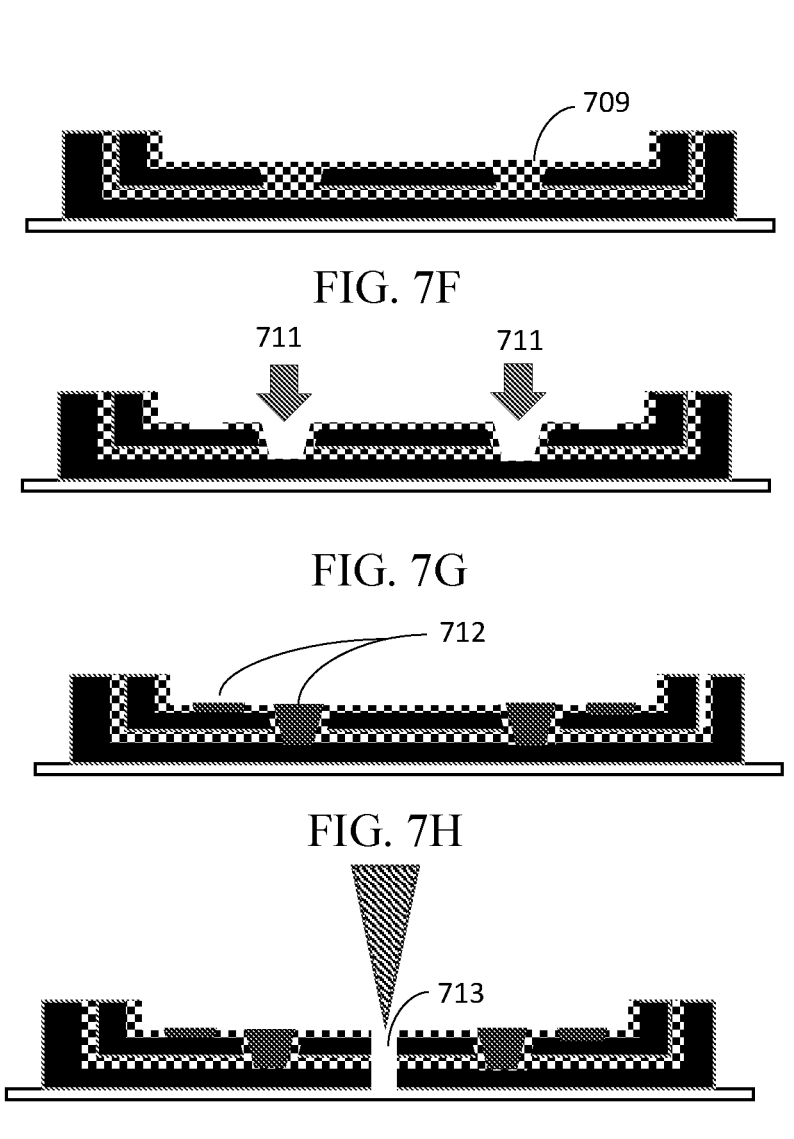
FIG. 7F
FIG. 7G
FIG. 7H
FIG. 7I
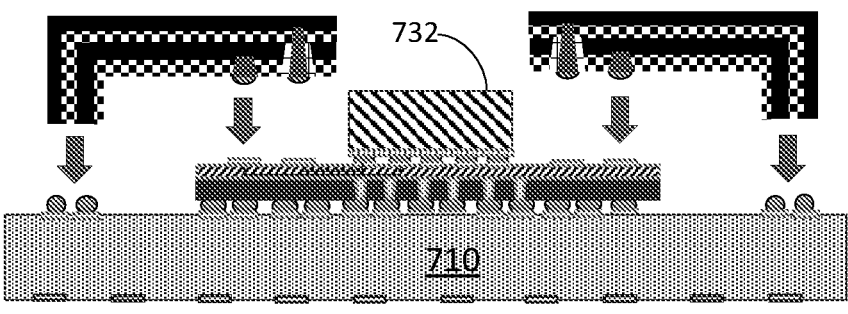
FIG. 7J

30

SEMICONDUCTOR PACKAGE WITH EXTENDED STIFFENER

BACKGROUND

As the form-factor of semiconductor packages continues to shrink to achieve system miniaturization for personal computing devices, the silicon device dimensions need to be scaled adequately. The reduction in thickness may lead to asymmetrical form-factors of various electrical components of the semiconductor packages, resulting in mechanical warpage concerns, especially for advanced 2.5D electronic semiconductor packages with silicon interposers.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 6 shows a simplified flow diagram for an exemplary method for making semiconductor packages according to an aspect of the present disclosure;

FIG. 7A to FIG. 7J illustrates a process for making the semiconductor package in accordance with an aspect of the disclosure.

DETAILED DESCRIPTION

Combining multiple integrated circuit dies in a single semiconductor package without stacking them into a three-dimensional integrated circuit (3D-IC) with through-silicon vias (TSVs) is commonly referred to as a 2.5D stacked integrated circuit (2.5D IC). In this kind of semiconductor package, many of the advantages of 3D integration can be approximated by placing electrical components (e.g., silicon dies and/or chiplets) side by side on an interposer instead of stacking them vertically. If the pitch is very fine and the interconnect very short, the assembly can be packaged as a single component with better size, weight, and power characteristics than a comparable 2D package or circuit board assembly. A problem encountered in such semiconductor packages, particularly where the electrical components do not have the same footprint, is a lack of a balanced profile, which results in a lack of warpage control.

Figure 1A:
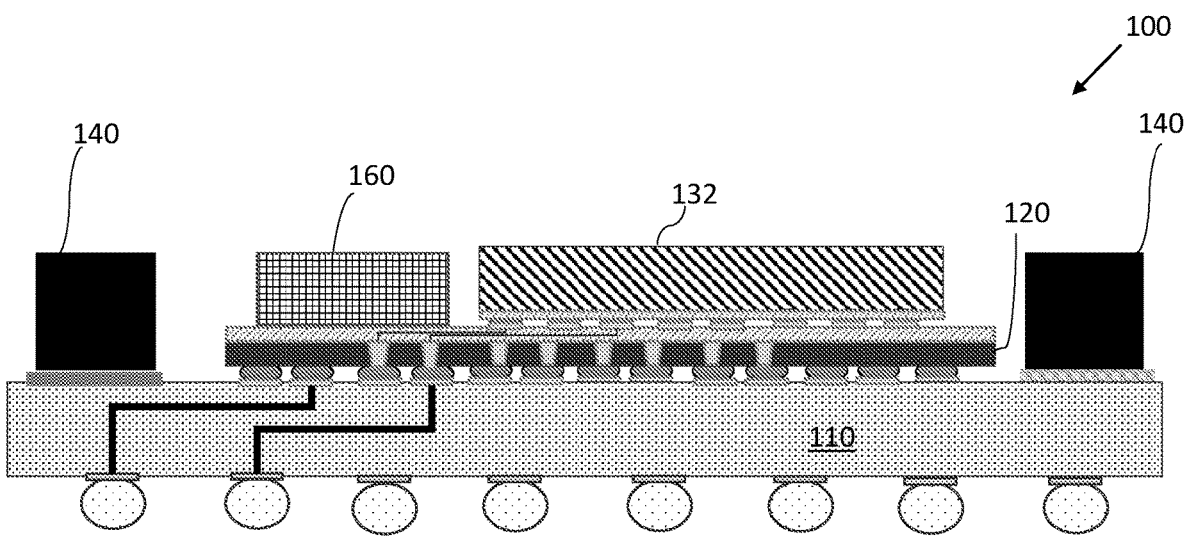
FIG. 1A illustrates a cross-sectional view of a conventional semiconductor package.

A previous attempt to obtain a balanced profile and to improve the warpage control for a semiconductor package 100, where the electrical components do not have the same lateral dimensions, includes the placement of "dummy dies" as depicted, for example, in FIG. 1A. In FIG. 1A, a package substrate 110 includes a base die 120 disposed on a top surface of the package substrate 110, the base die 120 including a first electrical component 132 disposed on a top surface of the base die 120. A stiffener 140 is disposed adjacent to the base die 120.

Figure 1B:
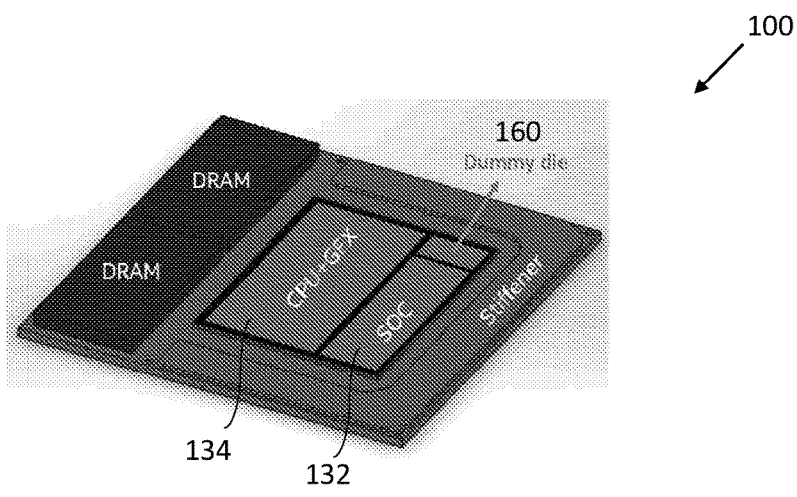
FIG. 1B illustrates a top view of a conventional semiconductor package.

With reference to FIG. 1B, the first electrical component 132 (e.g., a "system-on-chip" (SOC)) is configured adjacent to a second electrical component 134 (e.g., a central processing unit (CPU) combined with a graphic processing unit (GFX)), wherein the first electrical component 132 has a first footprint on the top surface of the base die 120 that is smaller than a second footprint on the top surface of the base die 120 for the second electrical component 134. For obtaining a balanced profile, the semiconductor 100 includes a dummy die 160 that is introduced adjacent to the electrical component 132. The balanced profile is required to address the mechanical warpage caused by the asymmetrical form-factor of the difference in dimensions, i.e., the difference between a first footprint of the first electrical component 132 on the top surface of the base die 120 and a second footprint of the second electrical component 134 on the top surface of the base die 120. For example, with reference to FIG. 1B, the SOC has a smaller footprint than the CPU+GFX, which is compensated with the dummy die 160.

However, a disadvantage associated with this approach includes problems with the I/O routing at a base die redistribution layer caused by the footprint occupied of the dummy die(s) 160, thereby inhibiting device miniaturization. This problem could be addressed with an increased base die metal redistribution layer (RDL) to overcome the I/O routing obstructions. Alternatively, an increased base die footprint could be employed to facilitate the increased requirement of TSVs and/or increased on-package decoupling capacitors for power delivery performance scaling. However, the disadvantages of the above-mentioned proposals include device form-factor trade-off ascribed to an increased footprint of the base die, package substrate, and/or the printed circuit board.

Figure 2A:
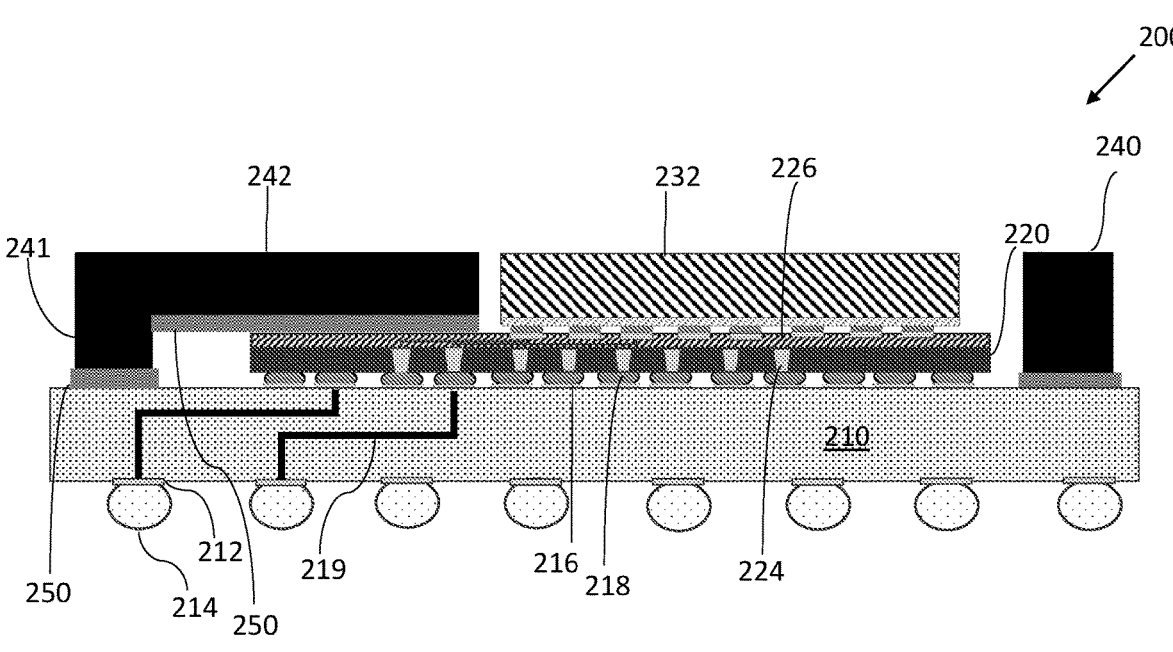
FIG. 2A illustrates a cross-sectional view of a semiconductor package in accordance with an aspect of the disclosure.
Figure 2B:
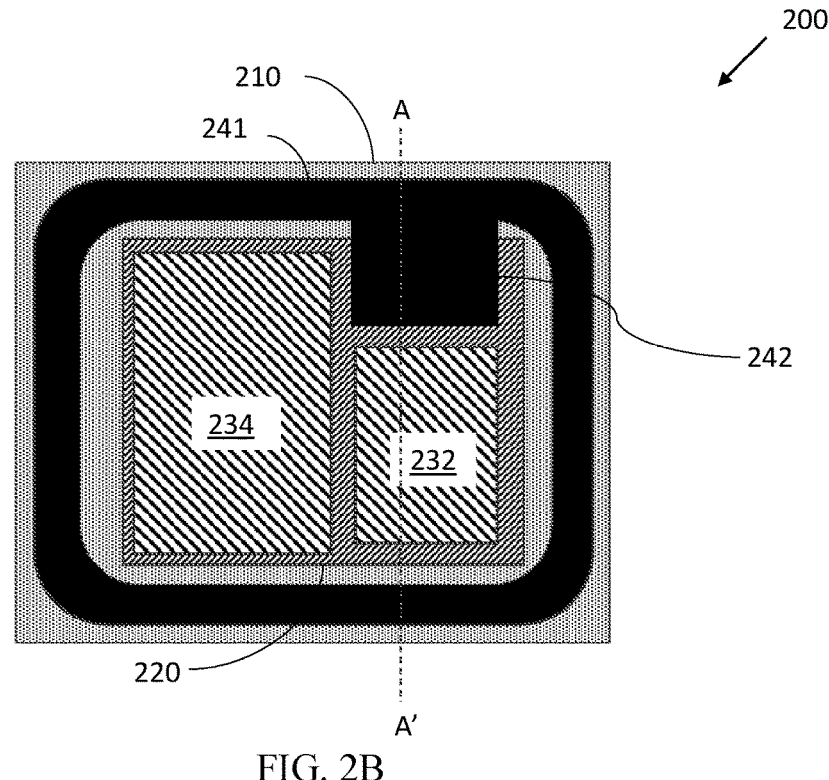
FIG. 2B illustrates a top view of a semiconductor package in accordance with an aspect of the disclosure.

To address these shortcomings, as illustrated in FIG. 2A and FIG. 2B, there is disclosed a semiconductor package 200 including: a package substrate 210 including a base die 220 disposed on a top surface of the package substrate 210, the base die 220 including a plurality of electrical components 230 disposed on a top surface of the base die 220, the plurality of electrical components 230 including a first electrical component 232 configured adjacent to a second electrical component 234, wherein the first electrical component 232 has a first footprint on the top surface of the base die 220 that is smaller than a second footprint on the top surface of the base die 220 for the second electrical component 234. The semiconductor package 200 may further include a stiffener 240 including a stiffener main portion 241, wherein the stiffener main portion 241 is affixed to the top surface of the package substrate 210 and configured at least partially surrounding the base die 220; and a stiffener extension portion 242 configured to extend from the stiffener main portion 241 to be disposed at least partially over the top surface of the base die 220 adjacent to the first electrical component 232 and the second electrical component 234.

Advantageously, since the stiffener 240 has an extension portion 242 configured to extend from the stiffener main portion 241 and disposed at least partially over the top surface of the base die 220 adjacent to the first electrical component 232 and the second electrical component 234, the stiffener 240 may be able to provide a balanced profile, thereby improving the warpage control by providing mechanical strength.

Moreover, due to the elimination of footprint constraints previously caused by the placement of dummy chiplet(s) on the base die, device miniaturization is enabled through improved I/O routing density. Hence, the semiconductor package 200 allows for I/O breakout routing at the RDL surface layer and/or metal RDL reduction.

A further advantage is obtained by streamlining the chiplet assembly process flow, which is caused by the elimination of dummy chiplet(s) assembly, ultimately resulting in reduced assembly throughput time.

FIG. 2A is a cross-sectional view of a semiconductor package 200, according to aspects of the present disclosure. FIG. 2B is a top view of the semiconductor package 200 of FIG. 2A.

In detail, FIG. 2A is a cross-sectional view of the semiconductor package 200 along a line A-A' shown in FIG. 2B. Referring to FIGS. 2A and 2B, the semiconductor package 200 may include a package substrate 210 including a bottom surface on which contact pads 212 are disposed. Solder balls 214 are respectively disposed on the contact pads 212. The package substrate 210 may further include a top surface on which contact pads 216 are disposed. Solder bumps 218 are respectively disposed on the contact pads 216. Wires 219 may connect a portion of the solder bumps 218 to a portion of the solder balls 214.

The package substrate 210 may include typical substrate materials. For example, the package substrate 210 may include an epoxy-based laminate substrate having a core layer for mechanical support and/or build-up layers. In one aspect, the package substrate 210 may include a coreless substrate i.e., an epoxy-based laminate substrate, and/or build-up layers without a rigid core layer. The package substrate 210 may include other suitable types of substrates in other aspects. For example, the package substrate 210 may include any suitable semiconductor material (e.g., silicon, gallium, indium, germanium, or variations or combinations thereof, among other substrates), one or more insulating layers, such as glass-reinforced epoxy, such as FR-4, polytetrafluoroethylene, cotton-paper reinforced epoxy, phenolic-glass, paper-phenolic, polyester-glass, Ajinomoto Build-up Film, any other dielectric material, such as bismaleimide-triazine epoxy resin, or any combination thereof, such as can be used in electronic package substrate and/or printed circuit boards (PCBs).

The semiconductor package 200 may further include a base die 220 disposed on a first portion of the solder bumps 218 for the package substrate 210. The base die 220 may include a silicon interposer or a stack-up of metal redistribution layers 226. The base die 220 may further include transistor devices. The base die 220 may include TSVs 224 connecting some of the solder bumps 218 to the top surface of the base die 220.

The base die 220 may include a plurality of electrical components 230 disposed on a top surface of the base die

220. At least one of the electrical components 230, e.g., a first electrical component 232, may have a footprint on the base die 220 that is smaller than a footprint of at least one other electrical component, e.g. a second electrical component 234. The "footprint" may be understood to refer to an area that is occupied by the respective electrical component 230 on the top surface of the base die 220. The difference in footprint of the electronic components 232 and 234 may thus create an uneven arrangement on the top surface of the base die 220.

Each of the electronic components 230 individually may be any electronic device or component that may be included in a semiconductor package 200, such as a semiconductor device (e.g., a die, a chip, a processor, computer memory, a platform controller hub, etc.). In one aspect, one of the electronic components 230 may represent a discrete chip. The electronic component 230 may include, or be a part of a processor (e.g., a CPU, a GPU, etc.), a memory device (e.g., SRAM, DRAM, flash memory, EEPROM, etc.), an application specific integrated circuit, a platform controller hub, a field programmable gate array, a system on a chip, a 3D-IC stack, a neural network accelerator, a system in a package, or a package on a package in some aspects. Although two electronic components 232, 234 are depicted in FIG. 2B, any suitable number of electronic components 230 may be included.

The package substrate 210 may include electrically conductive elements or electrical routing features (not shown) configured to route electrical signals to or from the electrical components 230. The electrical routing features may be internal (e.g., disposed at least partially within a thickness of the package substrate 210) and/or external to the package substrate 210. For example, in some aspects, the package substrate 210 may include electrical routing features such as pads, vias, and/or traces configured to receive the interconnect structures and route electrical signals to or from the electrical components 230. In particular, the electrical components 230 may be coupled to the package substrate 210 through a plurality of TSVs 224 in the base die 220. The pads, vias, and traces can be constructed of the same or similar electrically conductive materials, or of different electrically conductive materials.

The stiffener 240 can be affixed (i.e., mechanically coupled or otherwise attached) to the package substrate 210 in any suitable manner. The stiffener 240 may have a stiffener main portion 241 affixed to the top surface of the package substrate 210. The stiffener main portion 241 may be disposed about lateral sides of the base die 220, at least partially surrounding the base die 220. In this context, "lateral" is meant to indicate a side of the base die 220 that is substantially perpendicular to the top surface of both the package substrate 210 and the base die 220.

The lateral dimensions of the stiffener 240, as viewed in the top view of FIG. 2B, may be smaller than the lateral dimensions of the package substrate 210. In other words, as illustrated in FIG. 2B, the stiffener 240 may be placed on the package substrate 210 such that it does not completely cover the package substrate 210. Advantageously, such positioning may facilitate the stability of the package substrate 210.

The stiffener 240 may also have a stiffener extension portion 242 extending from the stiffener main portion 241. The stiffener extension portion 242 may be placed at least partially over the top surface of the base die 220. In other words, the stiffener extension portion 242 may be partially disposed over (e.g., on top of) the base die 220, e.g., covering portions of the top surface of the base die 220. Accordingly, the stiffener extension portion 242 may be disposed adjacent to the plurality of electrical components 230, and particularly covering an area of the base die 220 that is unoccupied by the electrical components 230. Such positioning of the stiffener extension portion 242 may counteract any unbalance created by the uneven arrangement caused by the difference in the first and the second footprint of the electronic components 232 and 234, respectively. The stiffener extension portion 242 may thus provide a balanced reaction of forces and moments from the plurality of electrical components 230, e.g., first and second electrical components 232 and 234.

In one aspect, the stiffener main portion 241 and the stiffener extension portion 242 may be integrally formed from the same material. In one aspect, the stiffener 240 may be made of a material that may include a metal, e.g., an aluminum or stainless steel. Alternatively, the material of the stiffener 240 may include an organic material that is coated with a metal, e.g., an epoxy mold with a conductive aluminum layer or an aluminum-copper composite layer. In one aspect, the organic mold may be reinforced with fiber glass for improved rigidity. In one aspect, the stiffener 240 may include a metal coated inorganic layer, e.g., a silicon or a glass substrate with a conductive aluminum layer or an aluminum-copper composite layer. Accordingly, the stiffener 240 may be constructed of a metal material, a ceramic material, a polymer material, a composite material, or any combination thereof. Alternatively, the stiffener 240 may be constructed of a non-conductive base material that is electroplated with a metal.

A thickness of the stiffener 240 may be about 50 μm to about 500 μm. The thickness of the stiffener 240 may be, in one aspect, homogenous across the stiffener main portion 241 and the stiffener extension portion 242. In another aspect, the thickness of the stiffener main portion 241 may be greater than the thickness of the stiffener extension portion 242.

The stiffener extension portion 242 may extend to the same height as the plurality of electrical components 230. Hence, the stiffener extension portion 242 and a top surface of the electrical components 230 may together form a surface that is substantially flush, e.g., they are coplanar (e.g., homogeneous) to each other. Advantageously, such a flush arrangement may facilitate placing additional components (e.g., a fan, or a heat spreader, not shown) on the semiconductor package 200. Moreover, the flush arrangement may be beneficial to save on space in the semiconductor package 200.

In one aspect, the stiffener main portion 241 affixed to the top surface of the package substrate 210 adjacent to the base die 220 may completely surround the base die 220. Advantageously, the more the stiffener main portion 241 surrounds the base die 220, the more warpage control may be provided.

An open space (e.g., an area on the top surface of the base die 220) occupied by the stiffener extension portion 242 may be referred to as a third footprint. The third footprint may be provided for by the smaller first footprint (e.g., smaller occupied area) of the first electrical component 232. In other words, the open space on the base die 220, which is unoccupied by an electrical component 230 due to the smaller footprint of the first electrical component 232 may be referred to as a third footprint. The stiffener extension portion 242 may provide compensation for the uneven configuration of the plurality of electrical components 230 by being placed on the third footprint. Such a compensating configuration of the stiffener 240 may serve to provide opposing forces and moments acting on the semiconductor package 200, thus increasing warpage control.

The open space on the top surface of the base die 220 that is available for the third footprint may range from approximately 200 μm×200 μm to 3000 μm×3000 μm, or from approximately 400 μm×400 μm to 2000 μm×2000 μm, or from approximately 600 μm×600 μm to 1000 μm×1000 μm.

The stiffener extension portion 242 may be in contact with the top surface of the base die 220 of the package substrate 210, which may enhance the coupling of the stiffener 240 and the package substrate 210.

In one aspect, the stiffener 240 may be affixed to the package substrate 210 at selected or spot interface locations or continuously about an interface between the top surface of the package substrate 210, the base die 220 and the stiffener 240 with an adhesive 250. Any suitable adhesive (e.g., epoxy cement, alumina or silicate-based ceramic adhesive, urethane adhesive, polyimide adhesive, etc.) may be utilized, such as an electrically conductive and/or an electrically non-conductive adhesive. For example, an electrically conductive and/or non-conductive adhesive 250 may be used when the stiffener 240 is made of an electrically conductive material.

Figures 3A, 3B:
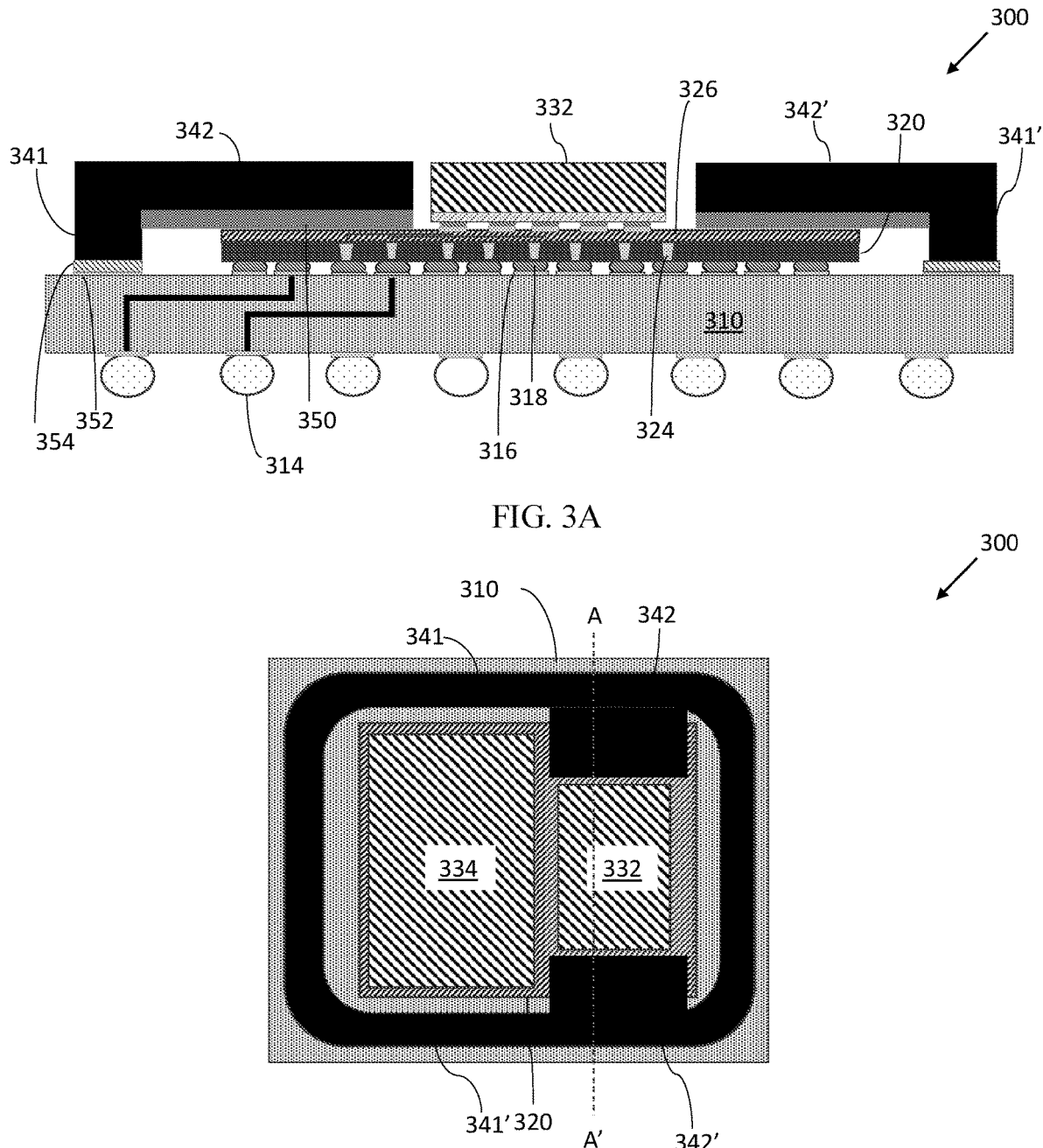
FIG. 3A illustrates a cross-sectional view of a semiconductor package in accordance with an aspect of the disclosure.
FIG. 3B illustrates a top view of a semiconductor package in accordance with an aspect of the disclosure.

FIG. 3A is a cross-sectional view of a semiconductor package 300, according to other aspects of the present disclosure. FIG. 3B is a top view of the semiconductor package 300 of FIG. 3A.

In detail, FIG. 3A is a cross-sectional view of the semiconductor package 300 along a line A-A' shown in FIG. 3B. Referring to FIGS. 3A and 3B, the semiconductor package 300 includes most of the elements of the semiconductor package 200 of FIGS. 2A and 2B.

The semiconductor package 300 may further include two stiffener extension portions 342 and 342' extending from the stiffener main portion 341 at stiffener main portion positions 341 and 341'. The two stiffener extension portions 342 and 342' may be positioned on two open spaces on opposing sides of the first electrical component 332. In other words, the first electrical component 332 may be positioned adjacent to the second electrical component 334 such that two open spaces are created on the base die 320 and consequently two stiffener extension portions 342 and 342' with two footprints may be required to compensate the unbalance caused by the positioning of the plurality of electrical components 330. The second open space on the top surface of the base die 320 that is available for the further (fourth) footprint may range from approximately 200 μm×200 μm to 3000 μm×3000 μm, or from approximately 400 μm×400 μm to 2000 μm×2000 μm, or from approximately 600 μm×600 μm to 1000 μm×1000 μm.

In one aspect, the stiffener main portion 341 may be affixed to the package substrate 310 with a solder layer 354. The solder layer 354 may be disposed on a contact pad 352. In an aspect, the stiffener 340 may be associated to a reference voltage e.g., a ground reference voltage (Vss) to provide electromagnetic shielding and current return path for the electrical components 330 and/or interconnections in the base die metal RDL 326.

Figure 4A:
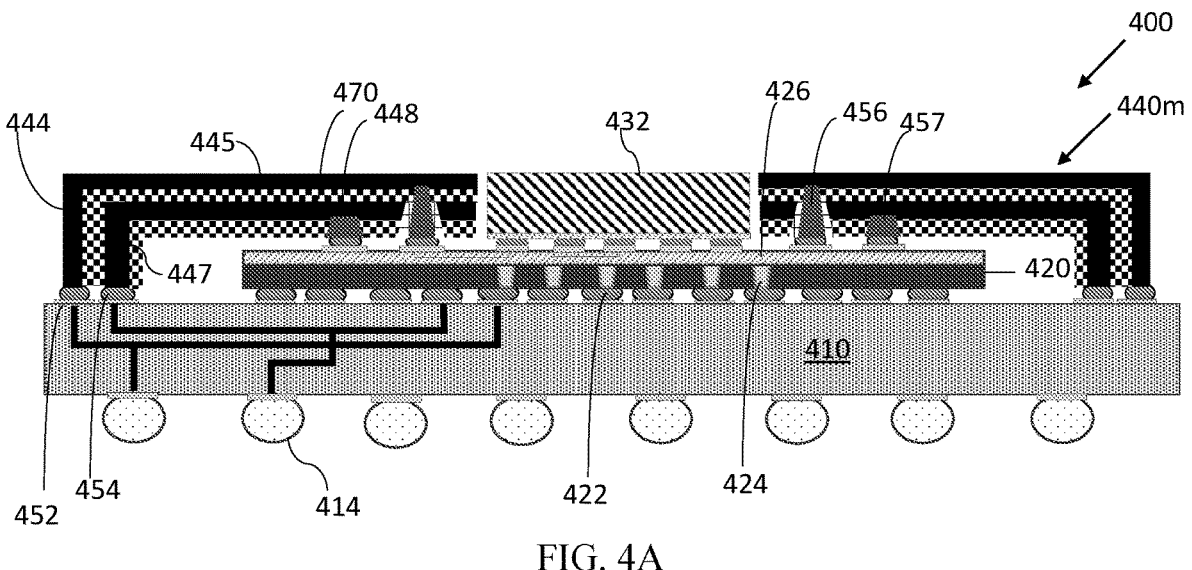
FIG. 4A illustrates a cross-sectional view of a semiconductor package in accordance with an aspect of the disclosure.
Figure 4B:
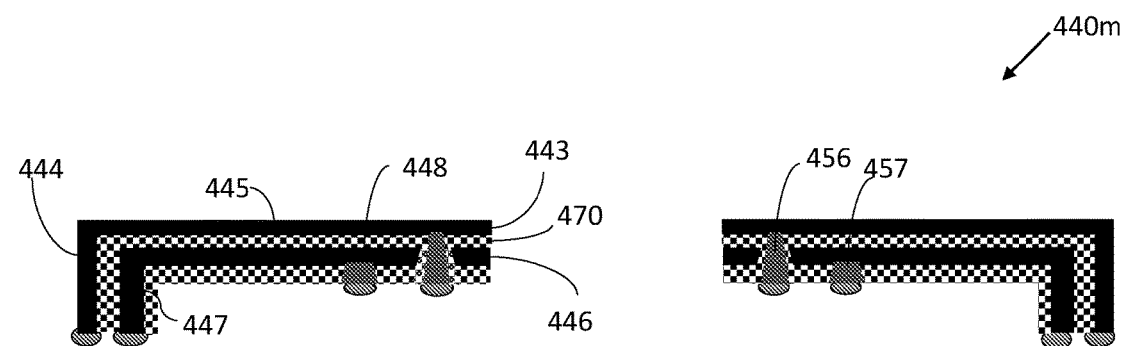
FIG. 4B illustrates a cross-sectional view of a multi-layer stiffener in accordance with an aspect of the disclosure.

FIG. 4A is a cross-sectional view of a semiconductor package 400, according to other aspects of the present disclosure. FIG. 4B is a cross-sectional view of the multilayered stiffener 440m of FIG. 4A.

In detail, FIG. 4A is a cross-sectional view of the semiconductor package 400 along a line A-A' (not shown). A top view of the semiconductor package 400 along a line A-A' would not differ from the top view referred to in FIG. 3B. Referring to FIGS. 4A and 4B, the semiconductor package 400 includes most of the elements of the semiconductor packages 200 and 300 of FIGS. 2A, 2B, 3A, and 3B.

The semiconductor package 400 may include a multi-layered stiffener 440*m*. The multi-layered stiffener 440*m* may include a first stiffener layer 443 and a second stiffener layer 446. Each of the first stiffener layer 443 and the second stiffener layer 446 may include a main portion and an extension portion, respectively. In other words, the first stiffener layer 443 may include a first main portion 444 and a first extension portion 445, while the second stiffener layer 446 may include a second main portion 447 and a second extension portion 448. The first stiffener layer 443 and the second stiffener layer 446 may be characterized with the same properties as the stiffener main portion 241, 341 and the stiffener extension portion 242, 342.

Positioning-wise, as illustrated in FIG. 4B, the second stiffener layer 446 may be nested inside the first stiffener layer 443 with the shape of the second stiffener layer 446 essentially following the shape (e.g., the contours) of the first stiffener layer 443. In other words, the second stiffener layer 446 may be nested in the first stiffener layer 443 such that the second main portion 447 is parallel to the first main portion 444, and the second extension portion 448 is parallel to the first extension portion 445. In such an arrangement, the first stiffener layer 443 may have bigger dimensions than the second stiffener layer 446, e.g., the first stiffener layer 443 may be the outer layer.

Advantageously, employing a multi-layer stiffener 440*m* may provide improved power delivery and mechanical warpage control. Moreover, the multi-layer stiffener 440*m* may have beneficial effects on the power integrity performance. In particular, the multi-layer stiffener 440*m* may allow for direct power delivery from the package substrate 410 to the electrical components 430. Further advantageously, the power delivery path may be equipped with reduced effective self-resistance (ESR) through the comparatively large stiffener layers compared to TSVs on the base die 420. Such a robust power delivery may allow for a reduced power supply induced jitter or noise, hence resulting in reduced latency and improved device bandwidth.

Between the first stiffener layer 443 and the second stiffener layer 446 may be disposed a dielectric layer 470. The dielectric layer 470 may be characterized as an electrical insulator between the first stiffener layer 443 and the second stiffener layer 446. Accordingly, the dielectric layer 470 may include a material that is substantially non-conductive, such as an epoxy polymer and/or a polyamide. In particular aspects, the material of the dielectric layer 470 may include glass-reinforced epoxy, such as FR-4, polytetrafluoroethylene, cotton-paper reinforced epoxy, phenolic-glass, paper-phenolic, polyester-glass, Ajinomoto Build-up Film, bismaleimide-triazine epoxy resin, polyimide adhesive or any combination thereof. The dielectric layer 470 may additionally be disposed between the second stiffener layer 446 and the base die 420.

The thickness of the dielectric layer 470 may range from 10 μm to 100 μm. Advantageously, this thickness range may provide a beneficial balance between insulating capacity and manufacturing costs.

One of the first stiffener layer 443 and the second stiffener layer 446 may be associated with a ground reference voltage while the other one may be associated with a power supply voltage. Advantageously, such a power connection may facilitate power delivery path with reduced effective self-resistance (ESR) through the comparatively large stiffener layers compared to TSVs on the base die 420. In other words, direct power delivery from the package substrate 410 to the electrical components 430 can be realized through the multi-layer stiffener 440*m*. Robust power delivery may further allow reduced power supply induced jitter or noise, hence reduced latency and improved device bandwidth.

In one aspect, the first stiffener layer 443 (e.g., the outer layer) may be associated with the ground reference voltage, while the second stiffener layer 446 may be associated with the power supply voltage. Advantageously, such an arrangement may be beneficial since it may allow for the first stiffener layer 443 (e.g., the outer layer) to provide additional shielding.

In one aspect, the second stiffener layer 446 may be coupled to the base die 420 through a plurality of second vias 457 or an array of micro bumps. In particular, while the second vias 457 could be disposed to connect to the base die 420 from any point of the second stiffener layer 446, including from the second main portion 447, in an advantageous aspect, the second vias 457 may be coupled to the base die 420 from the second extension portion 448 as a vertical via. Advantageously, when the plurality of second vias 457 connects to the base die 420 from the second stiffener layer 448 in a vertical direction, implementation of the second vias 457 would be facilitated and the coupling to the base die 420 would be more direct.

In one aspect, the first extension portion 445 of the first stiffener layer 443 may be coupled to the base die 420 through a plurality of vias 456 that may extend through the second extension portion 448. The vias 456 may be insulated from the second extension portion 448 by the dielectric layer 470, surrounding the vias 456.

In one aspect, the stiffener main portions 444 and 447 may be affixed to the package substrate 410 with a solder layer 454. The solder layer 454 may be disposed on a contact pad 452. Alternatively, the stiffener main portions 444 and 447 may be affixed to the package substrate 410 with an electrical adhesive (not shown).

Figure 5A:
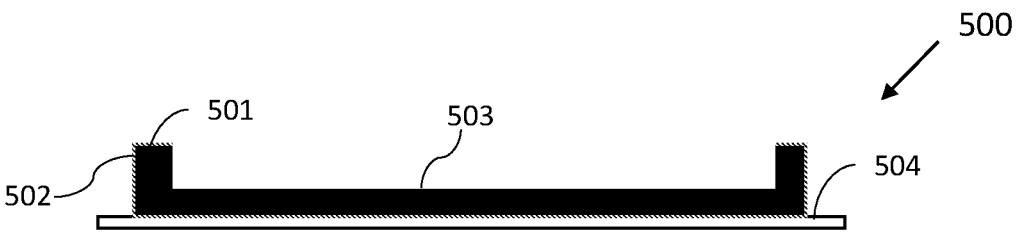
FIG. 5A to FIG. 5C illustrates a process for making the semiconductor package in accordance with an aspect of the disclosure.
Figure 5B:
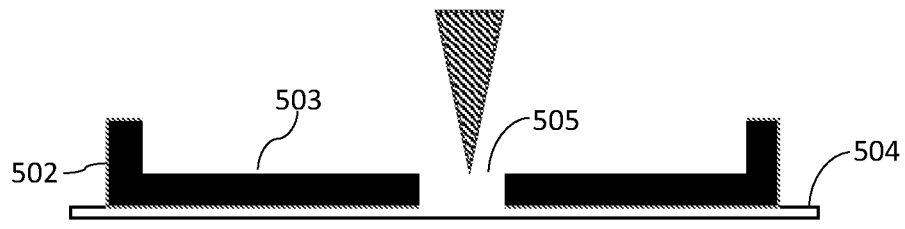
Figure 5C:
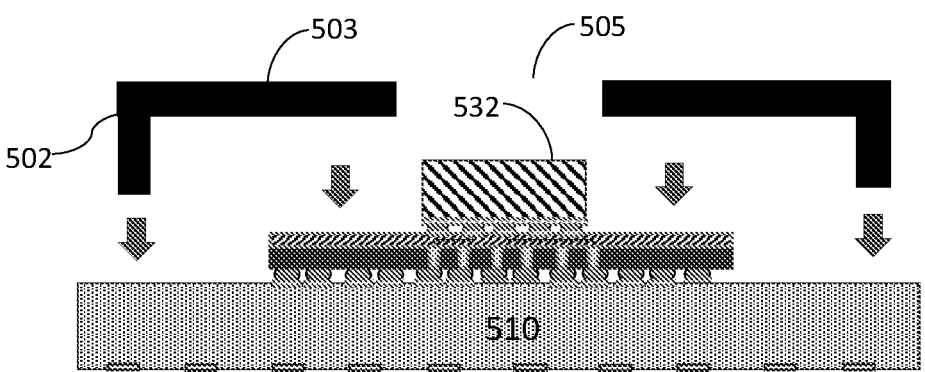

In another aspect, as illustrated in FIG. 5, there is provided a method 500 including: forming a stiffener 501 including a stiffener main portion 502 and a stiffener extension portion 503 by disposing a stiffener frame on a carrier 504 and removing a portion of the stiffener frame, thus forming a stiffener cavity (FIG. 5A). The removal of the portion of the stiffener frame may be carried out by a process selected from metal stamping, molding, milling, etching, or combinations thereof. Method 500 may include forming an adhesive layer (not shown) on the stiffener extension portion 503 within the stiffener cavity, for example, through a lamination process. Method 500 may further include forming an opening 505 in the stiffener extension portion 503 (FIG. 5B). This opening may be formed by mechanical separation, milling, cutting, or combinations thereof. Method 500 may further include providing a package substrate 510 having a base die disposed on a top surface of the package substrate and a plurality of electrical components arranged on a top surface of the base die, the plurality of electrical components including a first electrical component 532 configured adjacent to a second electrical component, wherein the first electrical component 532 has a first footprint on the top surface of the base die that is smaller than a second footprint on the top surface of the base die for the second electrical component. Method 500 may further include affixing the stiffener 501 to the package substrate 510, such that the stiffener main portion 502 is affixed to a top surface of the package substrate 510 adjacent to the base die and the stiffener extension portion 503 is configured to extend from the stiffener main portion 502 to be disposed at least partially over the top surface of the base die adjacent the first electrical component 532 and the second electrical component (FIG. 5C). The affixing to the package substrate 510 may be carried out by a process including solder reflow, thermal compression bonding, or combinations thereof.

FIG. 6 shows a simplified flow diagram for an exemplary method for making a semiconductor package with an extended stiffener according to an aspect of the present disclosure.

The operation 601 may be directed to forming a stiffener including a stiffener main portion and a stiffener extension portion by disposing a stiffener frame on a carrier and removing a portion of the stiffener frame.

The operation 602 may be directed to forming an opening in the stiffener extension portion.

The operation 603 may be directed to providing a package substrate having a base die disposed on a top surface of the package substrate and a plurality of electrical components arranged on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component.

The operation 604 may be directed to affixing the stiffener to the package substrate, such that the stiffener main portion is affixed to a top surface of the package substrate adjacent to the base die and the stiffener extension portion is configured to extend from the stiffener main portion to be disposed at least partially over the top surface of the base die adjacent the first electrical component and the second electrical component.

Figure 7A:
Figure 7B:
Figure 7C:
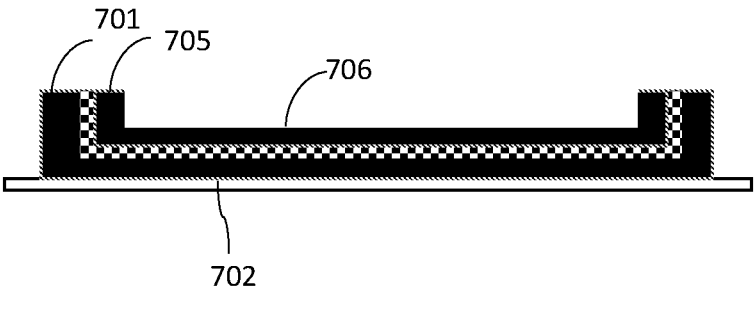
Figure 7D:
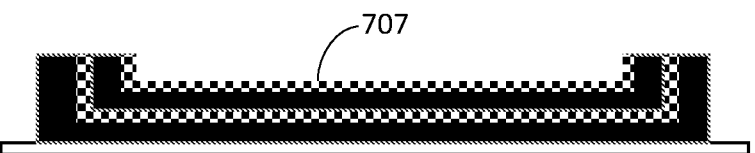
Figure 7E:
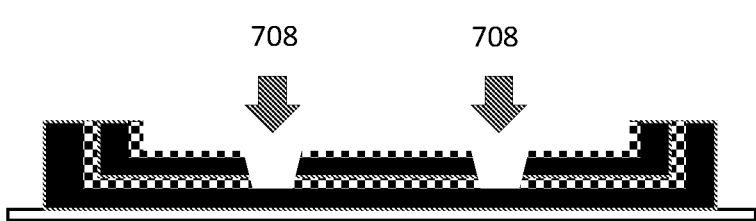

In one aspect, a method 700 is provided. Method 700 may include all the method steps of method 500, and may additionally include a step of forming a multi-layered stiffener including a first stiffener layer and a second stiffener layer. Forming the first stiffener layer may include disposing a first stiffener frame on a carrier 703; and removing a portion of the first stiffener frame to form a first main portion 701 and a first extension portion 702, wherein the first main portion 701 substantially perpendicular extends away from the first extension portion 702 (FIG. 7A). Method 700 may optionally include a step of applying a first dielectric layer 704 on the first stiffener layer (FIG. 7B), e.g. by a process step including lamination, printing, dispensing, or combinations thereof. Method 700 may include forming a second stiffener layer of the multi-layered stiffener including a second main portion 705 and a second extension portion 706, wherein the second main portion 705 follows a shape of the first main portion 701 and the second extension portion 706 follows a shape of the first extension portion 702. Method 700 may include arranging the second stiffener layer to be contained within a cavity formed by the first stiffener layer, e.g., by a hot press process (FIG. 7C). Subsequently, a second dielectric layer 707 may be disposed on the second stiffener layer (FIG. 7D), e.g. by a process including lamination, printing, dispensing, or combinations thereof. Method 700 may optionally include removing portions 708 of the second stiffener layer (and the first and second dielectric layer), which may be carried out by mechanical drilling, laser drilling, milling, or combinations thereof (FIG. 7E). Subsequently, a third dielectric layer 709 may be applied to the drill openings (FIG. 7F), e.g. by a process including lamination, printing, dispensing, or combinations thereof. Method 700 may optionally include a step of removing portions of the third dielectric layer 709 to form second drill openings 711 (FIG. 7G), which may be carried out by mechanical drilling, laser drilling, milling, or combinations thereof. The method 700 may optionally include a step of depositing a conductive layer in the second drill openings 711 to form a conductive layer 712 (FIG. 7H), e.g., a solder or copper layer, which may be carried out by paste printing or electroplating. Further process steps may be applied, substantially adapted from operations 602, 603, and 604. For example, FIG. 7I may include forming an opening 713 in the stiffener extension portion of the multi-layer stiffener. Finally, FIG. 7J may include providing a package substrate 710 having a base die disposed on a top surface of the package substrate 710 and a plurality of electrical components arranged on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component.

Method 700 may include affixing the multi-layered stiffener to the package substrate, such that the stiffener main portion of the multi-layered stiffener is affixed to a top surface of the package substrate 710 adjacent to the base die and the stiffener extension portion of the multi-layered stiffener is configured to extend from the stiffener main portion to be disposed at least partially over the top surface of the base die adjacent the first electrical component and the second electrical component.

The fabrication methods and the choice of materials presented above are intended to be exemplary for forming the present semiconductor packages. It will be apparent to those ordinary skilled practitioners that the foregoing process operations may be modified without departing from the spirit of the present disclosure.

Further aspects of the disclosure and advantages described for the semiconductor package 200 of the previous aspect can be analogously valid for the methods 500 and 700, and vice versa. As the various features, material properties and advantages have already been described above and in the examples demonstrated herein, they shall not be iterated for brevity where possible.

Figure 8:
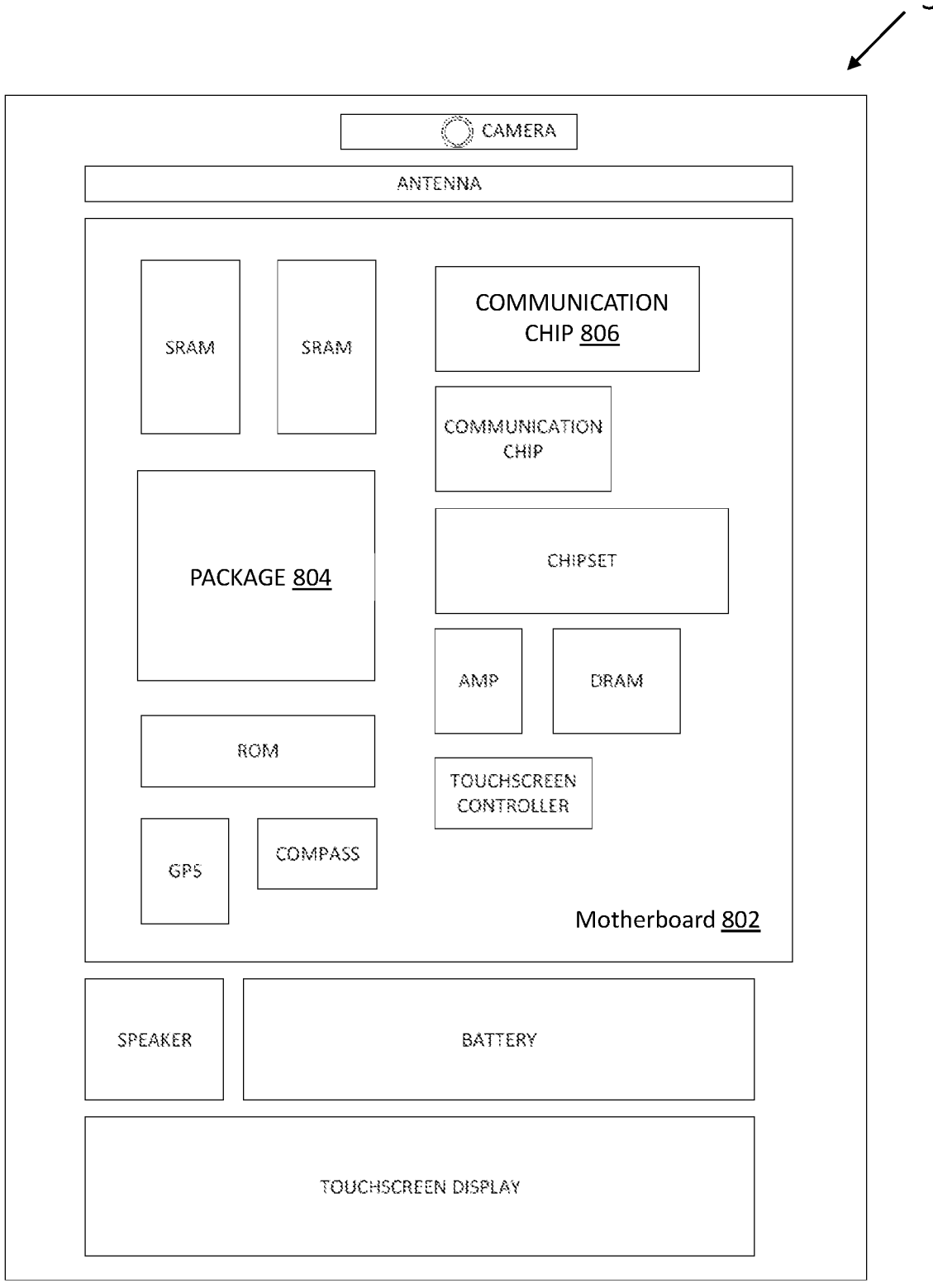
FIG. 8 shows an illustration of a computing device that includes a present semiconductor package according to a further aspect of the present disclosure.

Aspects of the present disclosure may be implemented into a system using any suitable hardware and/or software. FIG. 8 schematically illustrates a computing device 30 that may include a semiconductor package as described herein, in accordance with some aspects. According to the present disclosure, the computer device 30 may include a printed circuit board, a semiconductor package, which has a package substrate with stiffener.

Accordingly, there may be provided a computing device. The computing device may include a motherboard; and a semiconductor package coupled to the motherboard. The semiconductor package may include: a package substrate including a base die disposed on a top surface of the package substrate, the base die including a plurality of electrical components disposed on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component. The semiconductor package may further include a stiffener including a stiffener main portion, wherein the stiffener main portion is affixed to the top surface of the package substrate and configured at least partially surrounding the base die; and a stiffener extension portion configured to extend from the stiffener main portion to be disposed at least partially over the top surface of the base die adjacent to the first electrical component and the second electrical component.

Further aspects of the disclosure and advantages described for the semiconductor package 200 of the previous aspect can be analogously valid for the computing device, and vice versa. As the various features, material properties and advantages have already been described above and in the examples demonstrated herein, they shall not be iterated for brevity where possible.

In another aspect, the computing device 30 may house a board such as a motherboard 802. The motherboard 802 may include a number of components, including, but not limited to, a semiconductor package 804 and at least one communication chip 806. The semiconductor package 804 according to the present disclosure may be physically and electrically coupled to the motherboard 802. In some implementations, the at least one communication chip 806 may also be physically and electrically coupled to the motherboard 802. In further implementations, the communication chip 806 may be part of the semiconductor package 804.

Depending on its applications, computing device 30 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 804 of the computing device 30 may include a stiffener, as described herein.

The communication chip 806 may enable wireless communications for the transfer of data to and from the computing device 30. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 806 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 806 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other aspects.

The computing device 30 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

In various implementations, the computing device 30 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 30 may be a mobile computing device. In further implementations, the computing device 30 may be any other electronic device that processes data.

In a first example, there is a semiconductor package including a package substrate. The package substrate may include a base die disposed on a top surface of the package substrate, the base die including a plurality of electrical components disposed on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component; and a stiffener including: a stiffener main portion, wherein the stiffener main portion is affixed to the top surface of the package substrate and configured at least partially surrounding the base die; and a stiffener extension portion configured to extend from the stiffener main portion to be disposed at least partially over the top surface of the base die adjacent to the first electrical component and the second electrical component.

In a second example, the stiffener extension portion of Example 1 configured over an open space on the top surface of the base die may have a third footprint provided by the smaller first footprint of the first electrical component.

In a third example, the open space on the top surface of the base die of Example 2 that may be available for the third footprint may range from approximately 200 μm×200 μm to 3000 μm×3000 μm.

In a fourth example, the stiffener extension portion over the top surface of the base die of any one of Examples 1 to 3 may be affixed to the top surface of the base die with an adhesive.

In a fifth example, the stiffener main portion affixed to the top surface of the package substrate adjacent to the base die of any of the Examples 1 to 4 may completely surround the base die.

In a sixth example, the plurality of electrical components of any of the Examples 1 to 5 may have top surfaces that are substantially flush with a top surface of the stiffener extension portion.

In a seventh example, the first electrical component of any of the Examples 1 to 6 may be positioned adjacent to the second electrical component such that two open spaces are formed on the top surface of the base die. The stiffener extension portion may include two stiffener extension portions extending from the stiffener main portion to be disposed at least partially over the two spaces.

In an eighth example, the stiffener main portion of any of the Examples 1 to 7 may be electrically coupled to the top surface of the package substrate by at least one of a solder layer, a contact pad and an electrical adhesive.

In a ninth example, the stiffener of any of the Examples 1 to 8 may include a multi-layered stiffener including: a first stiffener layer and a second stiffener layer, the first stiffener layer including: a first main portion, wherein the first main portion is affixed to the top surface of the package substrate and configured at least partially surrounding the base die; and a first extension portion configured to extend from the first main portion to be disposed at least partially over the top surface of the base die adjacent to the first electrical component and the second electrical component; and the second stiffener layer including a second main portion and a second extension portion, wherein the second main portion follows a shape of the first main portion and the second extension portion follows a shape of the first extension portion.

In a tenth example, the multi-layered stiffener of Example 9 may include a dielectric layer that may insulate the first stiffener layer from the second stiffener layer.

In an eleventh example, the dielectric layer of Example 10 may have a thickness in a range of approximately from 10 μm to 100 μm.

In a twelfth example, the first stiffener layer of any of the Examples 9 to 11 may be associated with a ground reference voltage.

In a thirteenth example, the second stiffener layer of any of the Examples 9 to 12 may be associated with a power supply voltage.

In a fourteenth example, the first extension portion of any of the Examples 9 to 13 may be coupled to the base die through a plurality of first vertical vias extending through the second extension portion.

In a fifteenth example, the second extension portion of any of the Examples 9 to 14 may be coupled to the base die through a plurality of second vertical vias or an array of micro bumps.

In a sixteenth example, at least one of the first main portion and the second main portion of any of the Examples 9 to 15 may be electrically coupled to the package substrate by at least one of a solder layer, a contact pad and an electrical adhesive.

In a seventeenth example, there is provided a computing device, including: a motherboard; and a semiconductor package which may be coupled to the motherboard, the semiconductor package including: a package substrate having a base die disposed on a top surface of the package substrate, the base die including a plurality of electrical components disposed on a top surface of the base die, the plurality of electrical components including a first electrical component configured adjacent to a second electrical component, wherein the first electrical component may have a first footprint on the top surface of the base die that is smaller than a second footprint on the top surface of the base die for the second electrical component; and a stiffener including: a stiffener main portion, wherein the stiffener main portion may be affixed to the top surface of the package substrate configured at least partially surrounding the base die; and a stiffener extension portion configured to extend from the stiffener main portion to be disposed at least partially over the top surface of the base die adjacent to the first electrical component and the second electrical component.

In an eighteenth example, the semiconductor package of Example 17 may include a multi-layered stiffener including: a first stiffener layer and a second stiffener layer, the first stiffener layer including: a first main portion, wherein the first main portion is affixed to the top surface of the package substrate and configured at least partially surrounding the base die; and a first extension portion configured to extend from the first main portion to be disposed at least partially over the top surface of the base die adjacent to the first electrical component and the second electrical component; and the second stiffener layer including a second main portion and a second extension portion, wherein the second main portion follows a shape of the first main portion and the second extension portion follows a shape of the first extension portion.

In a nineteenth example, there is provided a method including: forming a stiffener including a stiffener main portion and a stiffener extension portion by disposing a stiffener frame on a carrier and removing a portion of the stiffener frame; forming an opening in the stiffener extension portion; providing a package substrate having a base die disposed on a top surface of the package substrate and a plurality of electrical components arranged on a top surface of the base die, the plurality of electrical components including a first electrical component configured adjacent to a second electrical component, wherein the first electrical component has a first footprint on the top surface of the base die that is smaller than a second footprint on the top surface of the base die for the second electrical component; affixing the stiffener to the package substrate, such that the stiffener main portion is affixed to a top surface of the package substrate adjacent to the base die and the stiffener extension portion is configured to extend from the stiffener main portion to be disposed at least partially over the top surface of the base die adjacent the first electrical component and the second electrical component.

In a twentieth example, the forming of the stiffener of Example 19 may include: forming a multi-layered stiffener including a first stiffener layer and a second stiffener layer, wherein forming the first stiffener layer may include disposing a first stiffener frame on a carrier; and removing a portion of the first stiffener frame to form a first main portion and a first extension portion, wherein the first main portion substantially perpendicular extends away from the first extension portion; and forming a second stiffener layer of the multi-layered stiffener including a second main portion and a second extension portion, wherein the second main portion follows a shape of the first main portion and the second extension portion follows a shape of the first extension portion; and arranging the second stiffener layer to be contained within a cavity formed by the first stiffener layer.

The dimensions of the semiconductor package and the choice of materials presented above are intended to be exemplary for forming the semiconductor package. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" or "approximately" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate comprising a base die disposed on a top surface of the package substrate, the base die comprising a plurality of electrical components disposed on a top surface of the base die, the plurality of electrical components comprising a first electrical component configured adjacent to a second electrical component, wherein the first electrical component has a first footprint on the top surface of the base die that is smaller than a second footprint on the top surface of the base die for the second electrical component; and
a stiffener comprising:
   a stiffener main portion, wherein the stiffener main portion is affixed to the top surface of the package substrate and configured at least partially surrounding the base die; and
   a stiffener extension portion configured to extend from the stiffener main portion to be disposed at least partially over the top surface of the base die adjacent to the first electrical component and the second electrical component,
   wherein the plurality of electrical components comprise top surfaces that are substantially flush with a top surface of the stiffener extension portion.

2. The semiconductor package of claim 1, wherein the stiffener extension portion configured over an open space on the top surface of the base die has a third footprint provided by the smaller first footprint of the first electrical component.

3. The semiconductor package of claim 2, wherein the open space on the top surface of the base die available for the third footprint ranges from approximately 200 µm×200 µm to 3000 µm×3000 µm.

4. The semiconductor package of claim 1, wherein the stiffener extension portion over the top surface of the base die is affixed to the top surface of the base die with an adhesive.

5. The semiconductor package of claim 1, wherein the stiffener main portion affixed to the top surface of the package substrate adjacent to the base die completely surrounds the base die.

6. The semiconductor package of claim 1, wherein the first electrical component is positioned adjacent to the second electrical component such that two open spaces are formed on the top surface of the base die and wherein the stiffener extension portion comprises two stiffener extension portions extending from the stiffener main portion to be disposed at least partially over the two open spaces.

7. The semiconductor package of claim 1, wherein the stiffener main portion is electrically coupled to the top surface of the package substrate by at least one of a solder layer, a contact pad and an electrical adhesive.

8. The semiconductor package of claim 1, wherein the stiffener comprises a multi-layered stiffener comprising:
a first stiffener layer and a second stiffener layer, the first stiffener layer comprising:
   a first main portion, wherein the first main portion is affixed to the top surface of the package substrate and configured at least partially surrounding the base die; and
   a first extension portion configured to extend from the first main portion to be disposed at least partially over the top surface of the base die adjacent to the first electrical component and the second electrical component; and
the second stiffener layer comprising a second main portion and a second extension portion, wherein the second main portion follows a shape of the first main portion and the second extension portion follows a shape of the first extension portion.

9. The semiconductor package of claim 8, wherein the multi-layered stiffener comprises a dielectric layer that insulates the first stiffener layer from the second stiffener layer.

10. The semiconductor package of claim 9, wherein the dielectric layer has a thickness in a range of approximately from 10 µm to 100 µm.

11. The semiconductor package of claim 8, wherein the first stiffener layer is associated with a ground reference voltage.

12. The semiconductor package of claim 8, wherein the second stiffener layer is associated with a power supply voltage.

13. The semiconductor package of claim 8, wherein the first extension portion is coupled to the base die through a plurality of first vertical vias extending through the second extension portion.

14. The semiconductor package of claim 8, wherein the second extension portion is coupled to the base die through a plurality of second vertical vias or an array of micro bumps.

15. The semiconductor package of claim 8, wherein at least one of the first main portion and the second main portion is electrically coupled to the package substrate by at least one of a solder layer, a contact pad and an electrical adhesive.

16. A computing device, comprising:
a motherboard; and a semiconductor package coupled to the motherboard, the semiconductor package comprising:
   a package substrate having a base die disposed on a top surface of the package substrate, the base die comprising a plurality of electrical components disposed on a top surface of the base die, the plurality of electrical components comprising a first electrical component configured adjacent to a second electrical component, wherein the first electrical component has a first footprint on the top surface of the base die that is smaller than a second footprint on the top surface of the base die for the second electrical component; and
   a stiffener comprising:
      a stiffener main portion, wherein the stiffener main portion is affixed to the top surface of the package substrate configured at least partially surrounding the base die; and
   a stiffener extension portion configured to extend from the stiffener main portion to be disposed at least partially over the top surface of the base die adjacent to the first electrical component and the second electrical component, wherein the plurality of electrical components comprise top surfaces that are substantially flush with a top surface of the stiffener extension portion.

17. The computing device of claim 16, wherein the stiffener comprises a multi-layered stiffener comprising:

a first stiffener layer and a second stiffener layer, the first stiffener layer comprising:

a first main portion, wherein the first main portion is affixed to the top surface of the package substrate and configured at least partially surrounding the base die; and a first extension portion configured to extend from the first main portion to be disposed at least partially over the top surface of the base die adjacent to the first electrical component and the second electrical component; and the second stiffener layer comprising:

a second main portion and a second extension portion, wherein the second main portion follows a shape of the first main portion and the second extension portion follows a shape of the first extension portion.

18. A method comprising:

forming a stiffener comprising a stiffener main portion and a stiffener extension portion by disposing a stiffener frame on a carrier and removing a portion of the stiffener frame;

forming an opening in the stiffener extension portion;

providing a package substrate having a base die disposed on a top surface of the package substrate and a plurality of electrical components arranged on a top surface of the base die, the plurality of electrical components comprising a first electrical component configured adjacent to a second electrical component, wherein the first electrical component has a first footprint on the top surface of the base die that is smaller than a second footprint on the top surface of the base die for the second electrical component, wherein the plurality of electrical components comprise top surfaces that are substantially flush with a top surface of the stiffener extension portion; and affixing the stiffener to the package substrate, such that the stiffener main portion is affixed to a top surface of the package substrate configured at least partially surrounding the base die and the stiffener extension portion is configured to extend from the stiffener main portion to be disposed at least partially over the top surface of the base die adjacent the first electrical component and the second electrical component.

19. The method of claim 18, wherein the forming of the stiffener comprises:

forming a multi-layered stiffener comprising a first stiffener layer and a second stiffener layer, wherein forming the first stiffener layer comprises:

disposing a first stiffener frame on a carrier; and removing a portion of the first stiffener frame to form a first main portion and a first extension portion, wherein the first main portion substantially perpendicular extends away from the first extension portion; and forming a second stiffener layer of the multi-layered stiffener comprising a second main portion and a second extension portion, wherein the second main portion follows a shape of the first main portion and the second extension portion follows a shape of the first extension portion; and arranging the second stiffener layer to be contained within a cavity formed by the first stiffener layer.

* * * * *